United States Patent [19]

Kliewer

[11] Patent Number: 4,728,243

[45] Date of Patent: Mar. 1, 1988

[54] CARRIER MANUAL LOAD/UNLOAD WORK STATION

[75] Inventor: Michael J. Kliewer, Santa Clara, Calif.

[73] Assignee: Intel Corporation, Santa Clara, Calif.

[21] Appl. No.: 871,069

[22] Filed: Jun. 5, 1986

[51] Int. Cl.⁴ .............................................. B65G 65/00
[52] U.S. Cl. .................................. 414/417; 414/286; 414/226
[58] Field of Search ............... 414/416, 417, 222, 286, 414/225, 226

[56] References Cited

U.S. PATENT DOCUMENTS

| | | | |
|---|---|---|---|
| 2,980,266 | 4/1961 | Boros | 414/226 |
| 3,407,949 | 10/1968 | Fegley | 414/416 |
| 3,960,056 | 6/1976 | Holstein et al. | 414/225 X |
| 4,247,241 | 1/1981 | Warren | 414/417 |
| 4,273,496 | 6/1981 | Papalexis | 414/417 |
| 4,284,383 | 8/1981 | Popendorf | 414/417 |
| 4,406,572 | 9/1983 | Karcher | 414/417 X |
| 4,411,579 | 10/1983 | Grone et al. | 414/417 |
| 4,611,966 | 9/1986 | Johnson | 414/226 X |
| 4,614,474 | 9/1986 | Sudo | 414/281 |
| 4,636,126 | 1/1987 | Spotts | 414/225 X |

Primary Examiner—Peter A. Aschenbrenner
Attorney, Agent, or Firm—Blakely, Sokoloff, Taylor & Zafman

[57] ABSTRACT

A manual loader/unloader work station for loading and unloading PGA devices from device carriers. A centralized work station providing easy access to sleeves of carriers and PGA devices is provided. Carriers are placed on a base which includes clip spreaders to spread the clips of the carrier to allow easy insertion and removal of the PGA devices. A biasing means is utilized to urge the PGA devices from the carriers when unloading is taking place. During loading, the biasing means may be removed so as not to interfere with the loading of the carriers. The biasing means includes posts which are aligned with holes in the carrier for ejecting the device.

13 Claims, 6 Drawing Figures

CARRIER MANUAL LOAD/UNLOAD WORK STATION

BACKGROUND OF THE INVENTION

1. Field of the Invention

This invention relates to the field of devices used for loading and unloading packaged semiconductor devices from test carriers.

2. Background Art

The manufacturing of packaged semiconductor devices includes the testing of those devices to determine if they meet design specifications. Certain packaged semiconductor devices are known as pin grid array (PGA) packages because the leads from the package are arranged in an array containing one or several rows and generally arranged in a rectangular grid pattern. As part of the testing of these PGA devices, they are inserted into a carrier. The carrier is generally a piece of molded plastic and includes clips for retaining the PGA device in place after insertion. The clips must be spread apart for removal of the PGA device.

In the prior art, automatic machines have been used for loading and unloading a PGA device from test carriers. A prior art automatic loading device uses suction to pick up the device and insert it in a test carrier. Automatic unloaders of the prior art use a pulley and cam system to position a suction device over a device and remove the device from the carrier. In a production environment, automatic loaders and unloaders often break down. In such instances, a reliable means for manually loading and unloading the devices into test carriers is required.

Therefore, it is an object of the present invention to provide a means which can be used for both manual loading and unloading of test carriers.

It is a further object of the present invention to provide a means which allows for high speed output and ease of operation. It is yet another object of the present invention to provide a loading/unloading mechanism which provides mechanical assistance to the operator in unloading a PGA device from a test carrier.

SUMMARY OF THE PRESENT INVENTION

A manual loader/unloader of packaged semiconductor devices to and from test carriers is described. The present invention is used to load or unload pin grid array (PGA) semiconductor devices with respect to test carriers. The test carriers have clips which are biased to hold a part once inserted into the carrier. The present invention utilizes a central work station which includes a receptacle (loader/unloader block) for retaining the test carriers and spreading the clips for ease of insertion of a PGA device, as well as sleeve holders to receive or deposit carriers or part. The central work station utilizes an ejector plunger which is biased upwardly by means of a spring. To remove a device, the test carrier and PGA device are inserted into the receptacle of the central work station. While the carrier clips are spread to clear the part, the ejector, having been depressed, moves up vertically a fixed amount to separate the device from the carrier. If there is difficulty in removing a package, a booster eject system consisting of a lever coupled to the base provides additional ejecting force on the ejector plunger. During loading, the ejector plunger is not needed and is therefore removed. A carrier is placed in the receptacle and fully inserted so that the clips are spread. A device is placed into the carrier. The loaded carrier is then removed, with the clips closing over the device. Test carriers and devices are contained in sleeves which are held in sleeve holders mounted to the base.

DETAILED DESCRIPTION OF THE PRESENT INVENTION

A manual loader/unloader for use with semiconductor devices inserted into test carriers is described. In the following description, numerous specific details are set forth, such as sleeve length, etc., in order to provide a more thorough understanding of the present invention. It will be obvious, however, to one skilled in the art, that the present invention may be practiced without these specific details. In other instances, well known structures have not been described in detail in order not to unnecessarily obscure the description of the present invention.

Figure 1:
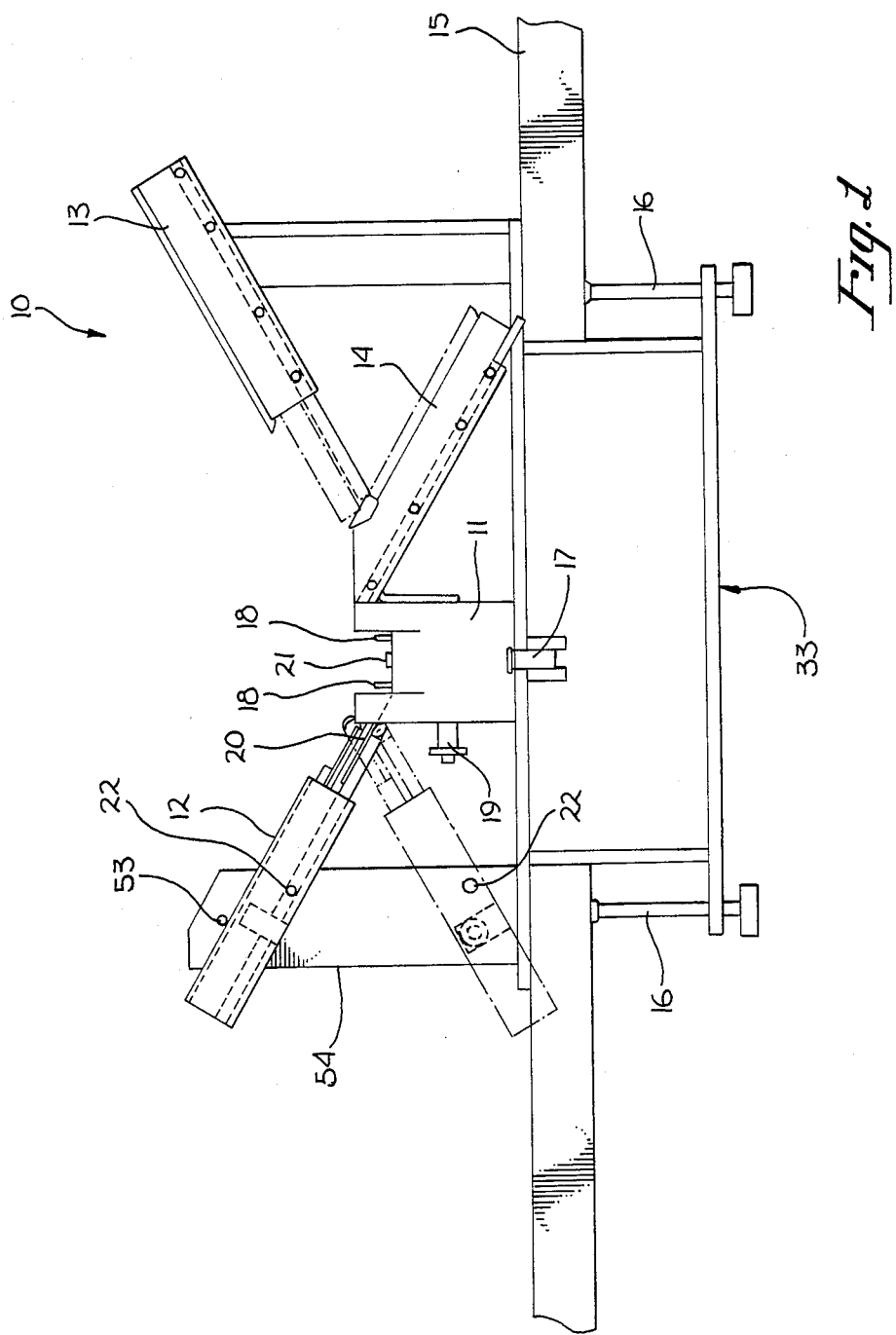
FIG. 1 is a front view of the present invention.

The preferred embodiment of the present invention is shown in detail in FIG. 1. The manual loader/unloader of the present invention comprises a base 11 and sleeve holders 12, 13 and 14. The base 11 is coupled to frame 33 in the preferred embodiment. The frame 33 is in turn removably mounted to ledge 15 by clamps 16. The ledge 15 may be a table, bench, or any other suitable means for securing the work station in a fixed position. In addition, the work station may be permanently mounted in a desired location. However, in a work environment employing a plurality of automatic loaders and/or unloaders, a portable work station can be used as a backup and moved into place upon the failure of an automatic loader or unloader.

The sleeve holders 13 and 14 are used to hold sleeves containing a plurality of carriers. As noted previously, these carriers in turn hold packaged semiconductor devices having a PGA contact pattern. Typically, sleeve holder 13 holds a sleeve of carriers which are removed one at a time and placed in the base 11 for operation (loading or unloading). The loaded or spent carriers (as the case may be) are then placed in a carrier-sleeve in sleeve holder 14.

Sleeve holder 12 is pivotally mounted to the base 11 by hinge 20. Sleeve holder 12 is used to hold a sleeve containing PGA devices. During the loading operation, sleeve holder 12 is secured in the elevated position through means of retractable plunger 22. The sleeve 12 is prevented from over pivoting when raised by straight pin 53. Straight pin 53 is mounted on vertical plate 54. During the unloading operation, sleeve holder 12 is utilized in the lowered position to receive parts. A second retractable plunger 22 holds sleeve 12 in place in the lowered position. As previously noted, the stage is limited in its movement by the constraints of pin 19 inserted in slot 52 (see FIG. 3). Additionally, since the stage is removable, the pin holds the stage 32 in place during the unloading operation.

Figure 4:
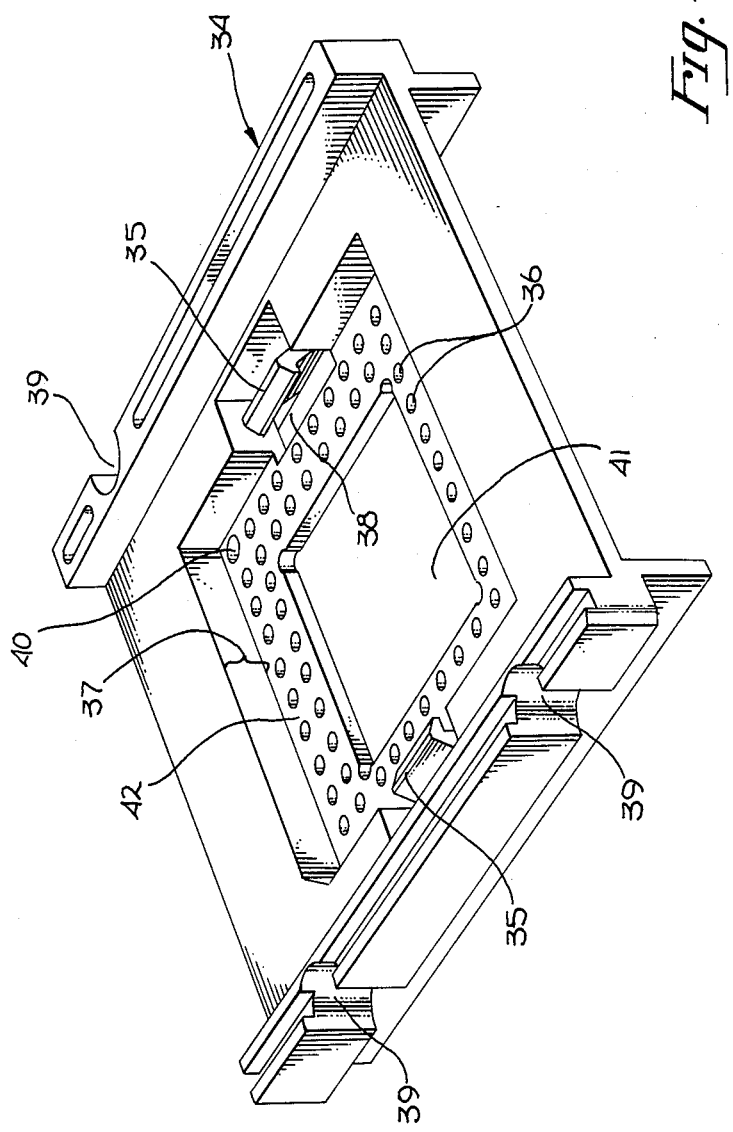
FIG. 4 illustrates a carrier used in conjunction with the present invention.

A reusable carrier 34 which is illustrative of the type utilized with the preferred embodiment of the present invention is shown in detail in FIG. 4. The carrier 34 is a receptacle in which a PGA device is loaded prior to testing. The carrier protects the device and allows for accurate placement of the PGA device in a contactor which is coupled to a tester. One such contactor is described in pending U.S. patent application Ser. No. 724,999 filed Apr. 19, 1985 entitled "LOW NOISE TEST CONTACTS FOR PIN GRID ARRAY" and assigned to the assignee of the present invention. After testing, the PGA devices are unloaded from the carriers and placed in a device sleeve for storage or shipping.

The carrier 34 is a generally rectangular frame. The frame includes a depression 37 culminating in a seating plane 42 which defines the area which the PGA device is to be loaded. The ledge 42 includes a plurality of openings 36 patterned to coincide with the array of contact pins on the PGA device itself. The carrier 34 includes clips 35 which are biased to extend over and restrain a PGA device when it has been inserted in the carrier. In the preferred embodiment of the present invention, the carrier 34 includes 3 indented openings 39 disposed around the edge of the carrier. These openings may be used to key the carrier in a test contactor or in the loading/unloading device itself. Openings 40 in ledge 42 accept posts 18 disposed on the base 11 of the present invention.

Figure 3:
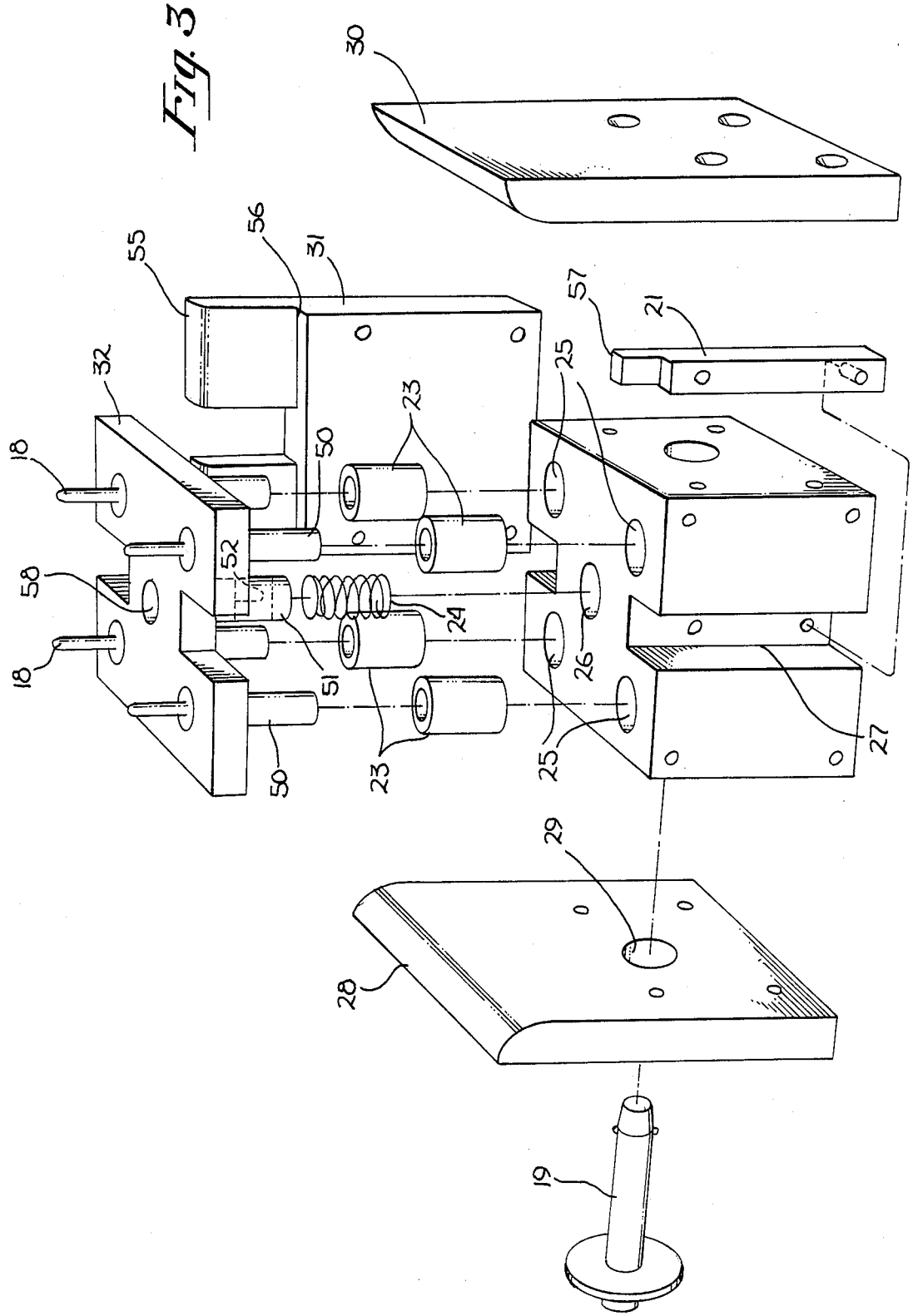
FIG. 3 illustrates a perspective view of the base of the present invention.

The base 11 is shown in detail in FIG. 3. The base includes four posts 18 disposed on the top of the stage 32 and corresponding to the openings 40 of the carrier 34. Clip spreaders 21 are extending members disposed on the base to extend through opening 38 of carrier 34 such that when the carrier is pressed down on the base, the clips 35 will be spread back, allowing easy placement or removal of a PGA device into the carrier. The spreaders 21 have a lead in radius 57 to spread the carrier clips 35 upon insertion.

Extending below the stage beneath each of the posts 18 are extended members 50 which are received by linear bearings 23 and openings 25 in the base respectively. A center post 51 extends below the stage and is received by opening 26 in the base. A spring 24 is disposed on post 51 and serves to provide an upward bias to the stage 32. Slot 52 in post 51 receives holding pin 19 so that the stage 32 is contained in its stroke. Stage 32 is utilized during unloading operations. Holding pin 19 in the preferred embodiment is a ball lock pin.

Figure 2:
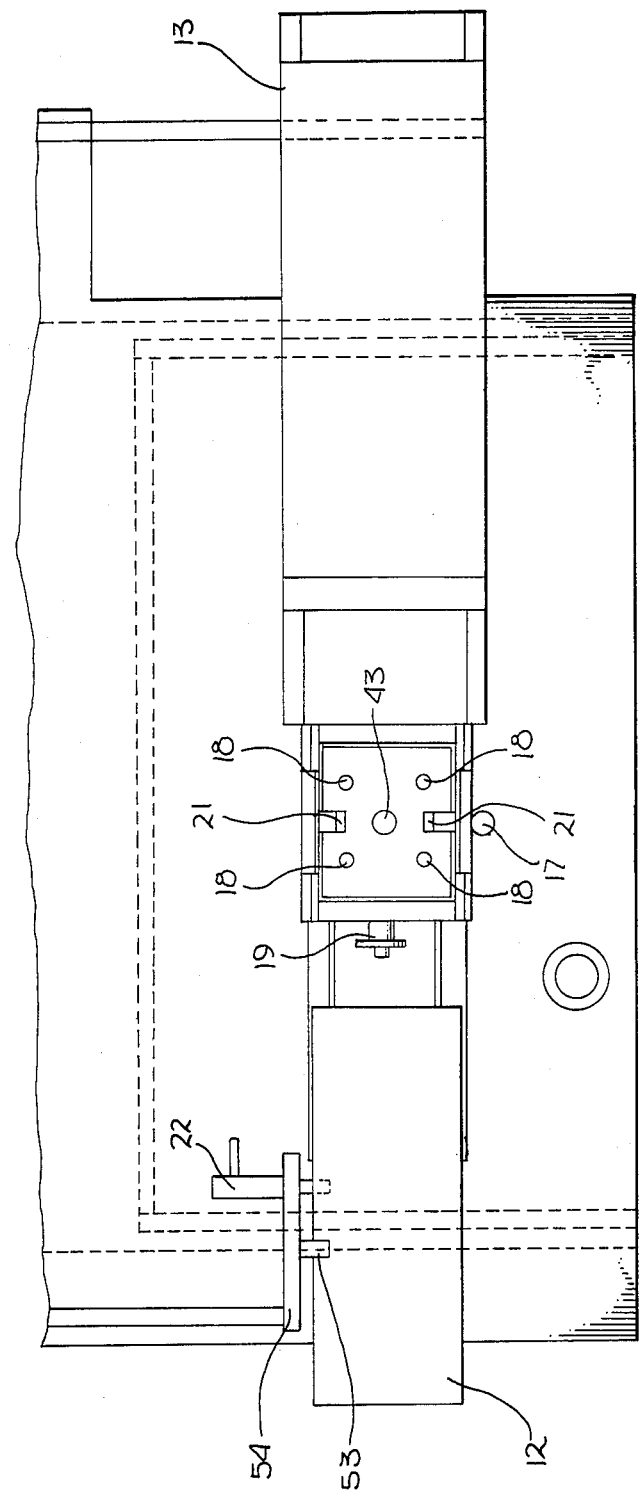
FIG. 2 illustrates a top view of the present invention.

During unloading operations, a sleeve of loaded carriers is inserted into sleeve holder 13. Sleeve holder 12 is placed in its lower position and held in place by a retractable plunger 22. The carrier is guided into place by lead-in radius 55 on the walls (such as wall 31) of the present invention. The device is depressed so that posts 18 enter openings 40 of carrier 34. Additional downward force on the carrier 34 causes the carrier and stage 32 to be depressed so that clip spreaders 21 can spread the clips 35 of the carrier 34. Prior to engaging the clip spreaders, the posts 18 do not eject the device since it is held in place by the clips 35. The carrier is depressed until it abuts ledge 56 of wall 31 and a corresponding ledge of the wall opposite the wall 31 (not shown). With the clips spread away from the device, the biasing force on the stage provided by spring 24 forces the stage upward, causing posts 18 to eject the device from the carrier. A plunger 22 is shown in the top view of the present invention of FIG. 2. As shown, the plunger 22 is mounted on and extends through vertical plate 54. The plunger 22 fits into an opening in sleeve 12. The plunger 22 is spring biased in the direction of the sleeve so as to provide a secure coupling.

Figure 5:
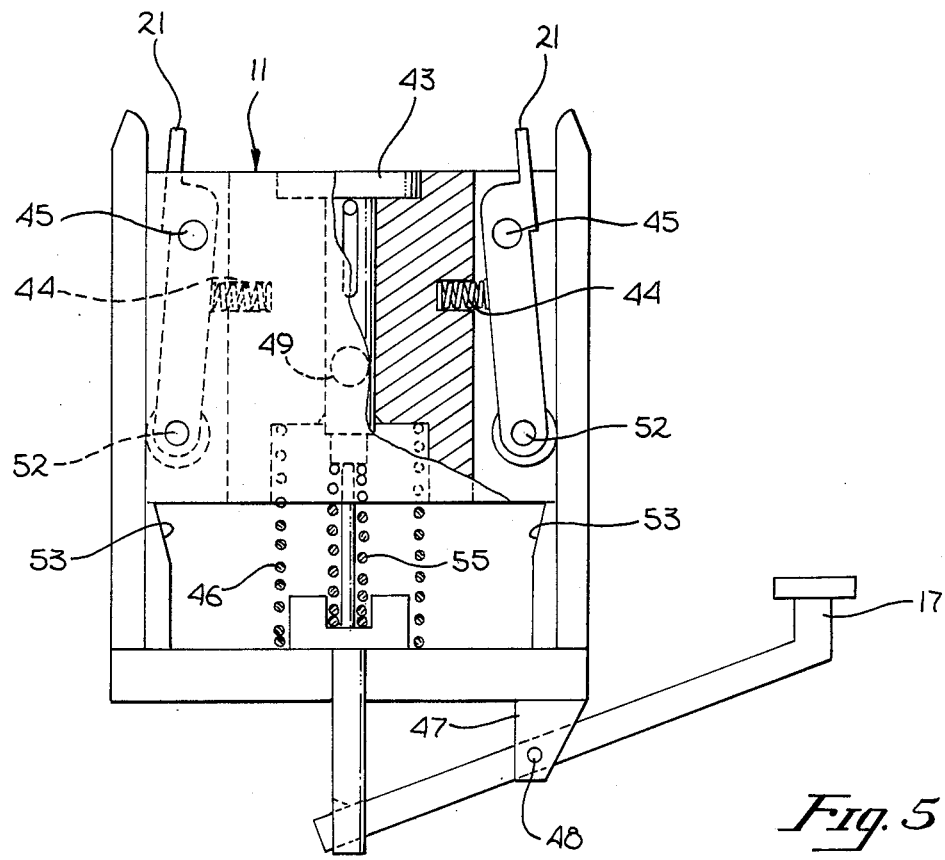
FIG. 5 is a cross-sectional side view of an alternate embodiment of the present invention.
Figure 6:
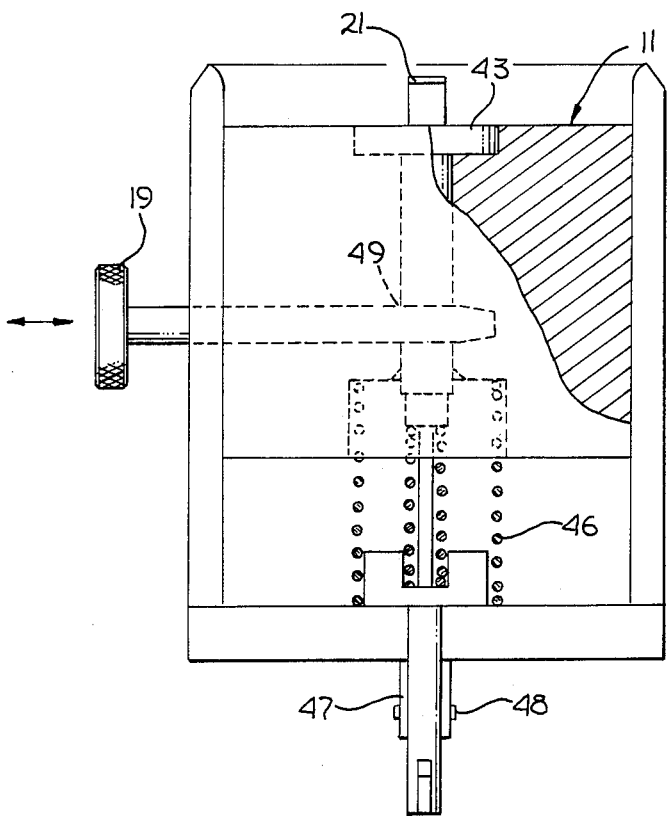
FIG. 6 is a cross-sectional front view of an alternate embodiment of the present invention.

At times the device may become stuck in the carrier. In those cases, the biasing force of the spring 24 is not strong enough to force the stage 32 upward so that posts 18 can eject the device. In those situations, a booster eject device, such as the device 17 schematically illustrated in FIGS. 5 and 6 is utilized. The booster eject device is a pivotally mounted lever arm having an extended member disposed through the base in opening 26 and abutting extension 51 of stage 32. In the preferred embodiment of the present invention, the booster eject device 17 is mounted so as to provide at least a two to one mechanical advantage to the operator. The operator simply depresses lever arm 17 causing the extended member to force the stage upward. This causes the post 18 to extend through holes 40 in the carrier and eject the loaded device.

For unloading operations, the stage 32 is removed and an identical stage, but not having posts 18, is inserted in its place. The purpose of the second stage is to provide a protective cover for the bushings and mechanisms of the receptacle. During loading, a sleeve of devices is inserted into sleeve holder 12. Sleeve holder 12 is held in its raised position through retractable plunger 22. A sleeve of empty carriers is placed in sleeve holder 13. An empty carrier is withdrawn from sleeve holder 13 and inserted into the receptacle. Again, the lead-in radius 55 guides the carrier into the proper position. The carrier is depressed until the clip spreaders 21 spread the clips 35. A device is then withdrawn from sleeve holder 12 and placed into the carrier with the leads extending through the openings 36 in the carrier. The carrier itself is then lifted up off the clip spreaders, causing the clips to close over the device, holding it in place. The loaded carrier is then inserted into a sleeve in sleeve holder 14.

A cross sectional view of an alternate embodiment of the present invention is shown in FIGS. 5 and 6. The clip spreaders 21 are pivotally mounted in openings in the base by use of pins 45. Each clip spreader 21 is biased by spring 44 toward the center of the base 11. Each clip spreader includes a bearing 52 mounted at one end. When a carrier is placed on the base, the clip spreaders 21 enter openings 38 of the carrier. As the carrier is further depressed upon the clip spreaders, the clip spreaders move toward ramps 53. The bearing 52 engages the ramp 53 and moves toward the center of base 11, causing the projecting portion of clip spreader 21 to move toward the outer edge of the base 11 spreading the clips 35 and allowing placement of a PGA device in the carrier. Plunger 43 is biased by spring 55 so that it will tend to extend above the surface of the base 11. In FIG. 5, the plunger 43 is shown in the retracted position. The boost means 17 comprises a lever pivotally mounted at point 48 by means of a pin or other suitable means. In the preferred embodiment, a bracket 47 extending from the base 11 supports a pin 48 extending through the boost means 17. Ideally, the boost means 17 provides a 2 to 1 mechanical advantage to the operator.

The base 11 is shown in a side cross sectional view in FIG. 6. Spring 46 biases sub-assembly block 11. The holding pin 19 extends through the opening 49 in the shaft of plunger 43. The holding pin 19 may be spring biased to the center of the base to keep plunger 43 retracted for loading.

The operation of the alternate embodiment is as follows. In order to load carriers, a carrier sleeve containing a plurality of empty carriers is placed in sleeve holder 13. An empty carrier sleeve is placed in sleeve holder 14 and a process sleeve of PGA devices is placed in process sleeve holder 12. Sleeve holder 12 is raised to its upper position and pin 22 is put in place to secure the sleeve holder 12. During loading operation, the plunger 43 is depressed and holding pin 19 is inserted through opening 49 of the plunger to hold it in its retracted position. A carrier is removed from sleeve holder 13 and placed on the base and guided into place by the lead-in radius of the walls. The carrier 34 is pressed down upon the base so that the clip spreaders 21 spread the clips 35 apart sufficiently to allow a PGA device to be placed therein. A PGA device is removed from sleeve holder 12 and placed in the carrier so that the contacts are aligned with openings 36 of carrier 35. The operator lifts up the carrier and the clips 35, no longer spread by clip spreaders 21, extend over the PGA device and hold it in place. The loaded carrier is then placed in the carrier sleeve in sleeve holder 14. This process continues, replacing the carrier sleeves and device sleeves as necessary.

In order to unload loaded carriers, a sleeve containing loaded carriers is placed in sleeve holder 13. An empty carrier sleeve is placed in sleeve holder 14 and sleeve holder 12 is moved to its lower position. Holding pin 19 is removed from plunger 43 so that the plunger may extend above the surface of the base 11. A loaded carrier is removed from sleeve holder 13 and placed on the base as before. As the carrier is pressed on the base 11, the clip spreaders 21 spread the clips 35 apart and the plunger 43 urges the PGA device from the carrier. The operator picks up the device and places it in the device sleeve in sleeve holder 12 and places the empty carrier in the carrier sleeve in sleeve holder 14. If a lead on PGA device has become bent while the device is in the carrier, the biasing effect of the plunger 43 may not be enough to remove the device from the carrier. In that situation, a booster 17 is utilized. The booster 17 is a lever which extends under the base 11 and abutts the bottom of the plunger 43. By depressing the booster 17, additional force, greater than that exerted by the spring, may be exerted on plunger 43 and therefore on the PGA device in a carrier disposed in the base. In this manner, the device may be urged from the carrier and the bent lead straightened as it passes through the opening 36.

Thus, a novel manual loader/unloader work station has been described.

I claim:

1. An apparatus for use in loading and unloading a packaged semiconductor device from a carrier, said carrier having clips to hold said device in said carrier, said apparatus comprising:
retention means for retaining said carrier, said retention means including members to spread said clips when said carrier is inserted into said retention means such that said device may be inserted into and removed from said carrier;
ejector means coupled to said retention means for removing said device from said carrier.

2. The apparatus of claim 1 wherein said ejector means comprises a spring biased stage having at least one post, said post extending through openings formed in said carrier.

3. The apparatus of claim 1 further including booster means for providing additional force to said ejector means and removing said devices from said carriers.

4. The device of claim 3 wherein said booster means comprises a pivotally mounted lever coupled to said base, said lever including a member extending through said base and abutting said ejector means.

5. The apparatus of claim 4 further including a first holding means coupled to said retention means, said first holding means for holding a first sleeve for storing a plurality of devices prior to loading into said carriers.

6. The apparatus of claim 5 further includes a second holding means coupled to said retention means, said second holding means for holding said first sleeve during unloading of said carriers.

7. The apparatus of claim 6 further including a third holding means coupled to said retention means, said third holding means for holding a second sleeve for storing said devices.

8. The apparatus of claim 7 wherein said third holding means is pivotally mounted on said retention means.

9. An apparatus for use in loading and unloading a packaged semiconductor device from a carrier, said carrier including clips to hold said device in said carrier, said apparatus comprising:
a base, said base including retention means for retaining said carrier, said base including extended members for spreading said clips when said carrier is inserted into said base;
first and second holding means coupled to said base for holding loaded and unloaded carriers;
third holding means coupled to said base for holding said devices;
mounting means coupled to said base for mounting said apparatus at a desired location;
ejector means disposed in said base, said ejector means including spring means such that said ejector means is biased against said device disposed in said carrier, when said carrier is inserted into said base.

10. The apparatus of claim 9 wherein said ejector means comprises a plunger disposed in an opening in said base, said plunger abutting a device in a carrier inserted into said apparatus so as to urge said device from said carrier.

11. The apparatus of claim 10 further including booster ejector menas comprising a pivotably mounted member having an extension on one end of said member, said extension disposed beneath said plunger, said booster means activated by applying a force to the other end of said member such that said force is applied to said plunger.

12. The apparatus of claim 11 wherein said first, second and third holding means comprise hollow members for accepting sleeves, each of said sleeves for holding a plurality of said carriers and devices.

13. The apparatus of claim 12 wherein said third holding means is pivotally mounted on said base.

* * * * *